Sept. 8, 1959 G. A. KWASNIEWSKI 2,902,691

BENDING MECHANISM

Filed Dec. 3, 1956

INVENTOR.
GEORGE A. KWASNIEWSKI
BY Robert E. Horn
ATTORNEY

United States Patent Office 2,902,691

Patented Sept. 8, 1959

2,902,691

BENDING MECHANISM

George A. Kwasniewski, Minneapolis, Minn., assignor to General Mills, Inc., a corporation of Delaware Application December 3, 1956, Serial No. 625,867

4 Claims. (Cl. 1—2)

The present invention relates to improvements in mechanisms for attaching electrical components to a circuit board and more specifically to a mechanism for bending and forming the leads of a component to a predetermined configuration for attaching a component to a printed circuit board.

Electrical components are ordinarily mounted on the circuit board by inserting the component leads into preformed holes or openings in the board and by crimping that portion of the leads extending below the board against conducting strips of metal so that the component then forms a part of the circuitry of the board.

The holes in the circuit board are predrilled to accommodate the insertion of the leads, and these holes are held to a relatively close tolerance. It is understood that the addition of such holes to the circuit board increases the cost of manufacture.

It is therefore an object of my invention to provide lead bending means to bend and form the leads of a component in such a manner that the component is attached to the edges of a circuit board, thereby eliminating the need for openings in the board.

A further object of the present invention is to provide a component lead support member that coacts with the lead bending means to support and shape the leads to a desired configuration for attachment to the edges of a circuit board.

Other objects and advantages of the invention will become more apparent in the following specification in connection with the appended drawings in which.

Figures 1, 2, 3, 4, 5, 6, 7, 8, 9:
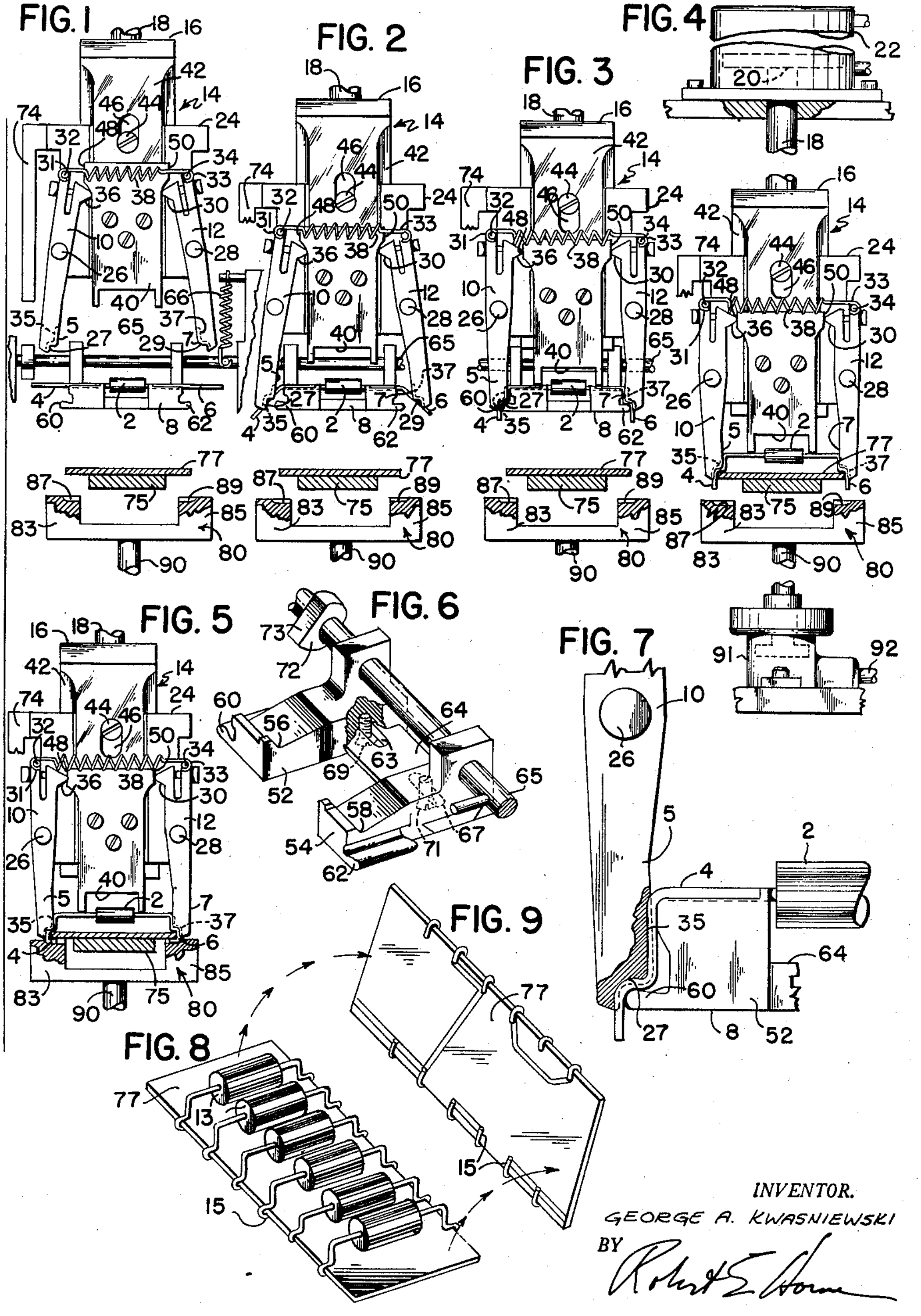
Figure 1 is a front elevational view of the attaching head prior to the bending of the component leads.
Fig. 2 is a front elevational view of the attaching head with the bending elements starting to bend the leads of the component.
Fig. 3 is a front elevational view of the attaching head with the bending elements moved inward to form the leads of the component.
Fig. 4 is a front elevational view of the attaching head seating the component on the edges of the circuit board.
Fig. 5 is a front elevational view of the attaching tool with the crimping unit crimping a portion of the component leads beneath the circuit board.
Fig. 6 is an isometric of the lead support member.
Fig. 7 is an enlarged front elevational view of the attaching finger and lead support member, showing the lead configuration prior to attachment to a circuit board.
Fig. 8 is an isometric of the components mounted on a circuit board.
Fig. 9 is a bottom view of the board of Fig. 8.

The mechanism shown illustrates the preferred embodiment of the present invention, whereby an electrical component such as a condenser, resistor, etc., is received on a lead support member, retained while its leads are bent and then attached to a circuit board by a pair of lead bending members.

To illustrate the operation of the mechanism the component shown is that of a resistor.

As shown in Fig. 1, a resistor is comprised of a body portion 2 having coaxial leads 4 and 6 extending laterally from its opposing ends. The resistor 2 is received and supported by an anvil support and lead forming member 8 which supports leads 4 to 6 while they are bent and formed in the desired configuration. The anvil support member 8 is positioned directly beneath the lead bending members 10 and 12 which are mounted to the attaching head 14.

The attaching head 14 has at its upper end 16 a pusher rod 18 mounted thereto. The pusher rod 18, as can be viewed in Fig. 4, is mounted at its upper end to the piston 20 of an air cylinder 22 for the purpose of providing vertical movement to the attaching head.

The air cylinder 22 is connected to a compressor (not shown) and when air is admitted above the piston 20 the attaching head 14 is lowered to the lead bending position and reversal of the movement occurs when air is admitted to the lower end of the piston 20, thus raising the attaching head 14 to a position above the anvil support member 8.

Referring now to the attaching head 14, the lead bending members 10 and 12 are pivotally mounted on a body block 24 by retaining pins 26 and 28. The upper ends of the lead bending members 10 and 12 are held inwardly by a spring 38. The spring is attached at its ends 31 and 33 to pins 32 and 34 mounted on the lead bending members 10 and 12. The lead bending members 10 and 12 are also provided on the upper end with cam surfaces 36 and 38 which face inwardly and bear upon the side surfaces of the cam plate 40. The cam plate is centrally located in respect to the lead bending members 10 and 12 and fixedly mounted to a sliding member 42 which has a limited free movement in relation to the body block 24. The limited movement of the cam plate 40 and the sliding member 42 is controlled by a stop screw 44 mounted in the body block 24 and extending laterally into a slot 46 of the sliding member 42. The length of the slot 46 determines the amount of travel between the sliding member 42 and the body block 24, before contact is made between the ends of the slot 46 and the stop screw 44.

Referring once again to the cam plate 40, it has at its upper end projecting surfaces 48 and 50 which protrude outwardly to a dimension somewhat wider than the lower portion of the cam plate.

As the cam plate 40 is moved downward by the sliding member 42, the cam surfaces 36 and 38 of the lead bending members 10 and 12 are forced outward by the projecting surfaces 48 and 50. Since the cam surfaces 36 and 38 are forced outward, the lower ends 5 and 7 of the lead bending members 10 and 12 are swung inward to a closed position. When the cam plate 40 is again moved upward, the cam surfaces 36 and 38 of the lead bending members 10 and 12 once more move away from the projecting surfaces 48 and 50 and the lower ends 5 and 7 of the lead bending members 10 and 12 are swung to an open position.

For the purpose of shaping and attaching the leads 4 and 6 of the component 2, the lead bending members 10 and 12 herein shown and described as attaching fingers, are provided at the lower ends 5 and 7 with inwardly facing stepped surfaces 27 and 29. As best viewed in Fig. 7, the stepped surfaces 27 and 29 are provided with centrally located concave grooves 35 and 37 along the inner faces. These grooves 35 and 37 follow the general contour of the stepped surfaces 27 and 29 and serve to shape and form the leads 4 and 6 of the component 2 to the desired configuration prior to their attachment to the circuit board.

Coacting with the stepped surfaces 27 and 29 in the forming of the leads 4 and 6 is an anvil support and lead forming member 8.

The anvil support and lead forming member 8 as best shown in Fig. 6 is composed of lead supports 52 and 54 having grooves 56 and 58 extending across their top surfaces for receiving and supporting the leads 4 and 6 of the component 2 during the lead bending and forming operation. The lead supports 52 and 54 are provided with ear portions 60 and 62 which mate with the stepped surfaces 27 and 29 of the attaching fingers 10 and 12 to bend and form the leads 4 and 6 of the component 2. The lead supports 52 and 54 are mounted to a connecting block 64 having adjustment by virtue of the slots 63 and 67 and the set screws 69 and 71. The screws 69 and 71 provide the lead supports 52 and 54 with adjustment to handle other sizes of components, or to bend the leads 4 and 6 to an extended or shortened length that is suitable for mounting the component 2 to a board of a different width and size. It is to be noted that the leads 4 and 6 of the component 2 are of a predetermined length for a particular board; however the leads are of such length prior to alterations that they may be cut to any desired length that falls within the scope of their over-all dimensions. The anvil support and lead-forming member 8 is pivotally supported by a shaft 65 and is retained in a support position by a spring 66.

To tilt the anvil support member 8 out of the path of the attaching head 14 after the leads 4 and 6 have been formed, a cam plate 72 is mounted on the shaft 65. The cam plate 72 has an inclined surface 73 which acts in cooperation with a cam arm 74 mounted on the attaching head 14, to tilt the anvil support member rearwardly out of the path of the downward movement of the attaching head 14.

The circuit board 77 to which the component 2 is mounted is positioned beneath the attaching head 14 such as by a support member 75. The support member 75 serves to retain the circuit board 77 while the component is attached and its leads are crimped, beneath the surface of the board.

For the purpose of crimping the leads 4 and 6 of the component 2, a crimping means 80 herein described as a crimping member is provided. The crimping member 80 is positioned beneath the circuit board 77 and the support member 75. A pair of crimping arms 83 and 85 having horizontal groves 87 and 89 are positioned beneath the leads 4 and 6 of the component 2. The crimping member 80 is provided with vertical movement by a piston 90 of an air cylinder 91. Air is admitted to the air cylinder through a supply line 92 thus raising the piston and the crimping member to a crimping position. The air supply and electrical control mechanism for actuating the attaching head and the crimping means is not herein described but is substantially as shown in the Bergsland and Hedin application, Serial No. 478,052, filed December 28, 1954.

Referring now to the general operation of the mechanism as shown in Figs. 1 through 5, the resistor 2 is received on the anvil support member 8 where its leads 4 and 6 rest in the grooves 56 and 58 that extend across the top surfaces of the component lead supports 52 and 54. The grooves 56 and 58 serve to position the leads directly beneath the concave grooves 35 and 37 of the stepped surfaces 27 and 29 of the attaching fingers 10 and 12.

It will be noted that the lead forming and attaching members 10 and 12 are in a spread position when the attaching head is retracted to a starting position and that cam surfaces 36 and 38 are in engagement with the cam plate 40 below its extended surfaces 48 and 50. As air is admitted to the air cylinder 22 the attaching head moves downward. However, engagement of the bending fingers 10 and 12 with the leads 4 and 6 of the component 2 creates a frictional force sufficient to stop the body block 24. The sliding member 42 having free movement in the body block 24 continues downward engaging the lower end 41 of the cam plate 40 with the portion of leads 4 and 6 which are being supported on the anvil support member 8. At the same time the lead bending fingers 10 and 12 which are pivotally mounted to the body block 24 are forced outward at their upper ends by extended surfaces 48 and 50 of the cam plate 40. The outward movement of the upper ends of the lead bending fingers 10 and 12 causes the lower ends 5 and 7 to pivot inwardly forming the leads 4 and 6 between the anvil support member 8 and the lead bending fingers 10 and 12. When this is accomplished, continuing movement of the pusher rod 18 engages the cam arm 70 with the inclined surface 73 of the cam plate 72 to tilt the anvil support member 8 to a position out of the path of the attaching head 14.

The attaching head 14 continues its downward movement to seat the component leads 4 and 6 on the circuit board 77. The circuit board 77 is positioned and supported beneath the lead bending fingers 10 and 12 by the board support member 75 above the lead crimping unit 80.

When the attaching head 14 has seated the component 2 on the circuit board 77, as shown in Fig. 4, air is admitted to the air cylinder 91 causing the piston 90 to move the crimping unit 80 upward, bending the leads 4 and 6 against the underside of the board and into engagement with the printed circuitry of the circuit board, as shown in Fig. 5. The board is held in a lead crimping position by the bending fingers 10 and 12.

The attaching head 14 is retracted to the position shown in Fig. 1 when the crimping of the leads is completed, by having air admitted to the underside of the piston 18 of the air cylinder 22.

As may be viewed in Figs. 8 and 9, the completed circuit board may be composed of a series of components such as 13 and are held to the board and against the printed circuitry by the crimped lead portions 15.

I have, in the specification and drawings, presented a detailed disclosure of the preferred embodiments of the present invention, and it is to be understood that the invention is subject to modifications and changes and it is therefore not intended to limit the scope of the invention to the specific form disclosed but to cover all modifications and improvements falling within the scope of the principles taught by the invention as set out in the appended claims.

Now, therefore, I claim:

1. In a mechanism for attaching electrical components having coaxial leads to a circuit board, the improvement comprising, a forming anvil having a pair of support members spaced apart and provided with means to support the leads of a component, said support members provided with vertical side portions, said sides having a horizontal forming ear projecting outward from their lower end, means interspaced between said support members to provide lateral adjustment, said lateral adjustment having means to secure said support members in said spaced relation with each other.

2. In a mechanism for attaching electrical components having coaxial leads to a circuit board including in combination, a pair of pivotally mounted fingers for bending said coaxial leads, a separate anvil means supporting each coaxial lead during bending and forming of said leads, each anvil having a vertical side portion, said vertical side portion having at the lower end thereof a substantially horizontally extending forming ear, said pair of fingers pivoting inward at their lower ends to engage and form each lead of the component against the vertical side portion of each anvil and said forming ear of each anvil prior to attachment of the electrical component to a circuit board.

3. In a mechanism for attaching electrical components having coaxial leads to a circuit board, including in combination, means for supporting and bending the leads to a stepped configuration, and means to attach said leads to opposing exterior edges of a circuit board, said lead attaching means including a pair of lead forming and attaching fingers provided with stepped lower end surfaces along the inner faces, said stepped surfaces having concave grooves centrally located therein and extending normal to said stepped surfaces, said grooves following the general configuration of said stepped portion.

4. In a mechanism for attaching electrical components having coaxial leads to a circuit board, including in combination, means for supporting and bending the leads to a stepped configuration, comprising an anvil type support member having a top surface adapted to receive and support the leads of a component, said anvil having a pair of vertical side portions, said vertical side portions having at the lower ends thereof a horizontally extending forming ear, and lead bending fingers having movement to engage and form the leads of the component against said vertical side portion and said forming ear prior to attachment of the component to a circuit board.

References Cited in the file of this patent

UNITED STATES PATENTS

| | | |
|---|---|---|
| 2,138,495 | Lewis | Nov. 29, 1938 |
| 2,177,862 | Buttner | Oct. 31, 1939 |